US009832867B2

(12) United States Patent
Day et al.

(10) Patent No.: US 9,832,867 B2
(45) Date of Patent: Nov. 28, 2017

(54) EMBEDDED METALLIC STRUCTURES IN GLASS

(71) Applicant: Medtronic, Inc., Minneapolis, MN (US)

(72) Inventors: John K. Day, Chandler, AZ (US); David A. Ruben, Mesa, AZ (US); Michael S. Sandlin, Chandler, AZ (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 14/949,277

(22) Filed: Nov. 23, 2015

(65) Prior Publication Data

US 2017/0150600 A1    May 25, 2017

(51) Int. Cl.
| | | |
|---|---|---|
| H01L 21/30 | (2006.01) |
| H05K 1/03 | (2006.01) |
| H05K 1/09 | (2006.01) |
| H05K 1/11 | (2006.01) |
| H05K 1/14 | (2006.01) |
| H05K 3/10 | (2006.01) |

(Continued)

(52) U.S. Cl.
CPC .......... *H05K 1/0306* (2013.01); *H01L 23/15* (2013.01); *H01L 23/49827* (2013.01); *H05K 1/09* (2013.01); *H05K 1/115* (2013.01); *H05K 1/144* (2013.01); *H05K 3/10* (2013.01); *H05K 3/4007* (2013.01); *H05K 3/4038* (2013.01); *H05K 3/4611* (2013.01); *H05K 3/4644* (2013.01); *H01L 21/6835* (2013.01); *H01L 23/49822* (2013.01); *H05K 2201/09036* (2013.01)

(58) Field of Classification Search
CPC .............. H05K 1/0306; H01L 23/3114; H01L 21/2007
USPC .................................................. 438/455, 456
See application file for complete search history.

(56) References Cited

U.S. PATENT DOCUMENTS 4,394,712 A * 7/1983 Anthony ............. H01L 23/5385
174/256
5,861,019 A    1/1999 Sun et al.
(Continued)

FOREIGN PATENT DOCUMENTS

| CA | 2515375 A1 | 8/2004 |
|---|---|---|
| WO | 97/06853 | 2/1997 |
| WO | 2012/018583 A1 | 2/2012 |

OTHER PUBLICATIONS (PCT/US2016/062445) PCT Notification of Transmittal of the International Search Report and the Written Opinion of the International Searching Authority, mailed Feb. 10, 2017, 11 pages.

*Primary Examiner* — Steven T Sawyer

(57) ABSTRACT

A device having embedded metallic structures in a glass is provided. The device includes a first wafer, at least one conductive trace, a planarized insulation layer and a second wafer. The first wafer has at least one first wafer via that is filled with conductive material. The at least one conductive trace is formed on the first wafer. The at least one conductive trace is in contact with the at least one first wafer via that is filled with the conductive material. The planarized insulation layer is formed over the first wafer and at least one conductive trace. The planarized insulation layer further has at least one insulation layer via that provides a path to a portion of the at least one conductive trace. The second wafer is bonded to the planarized insulation layer.

10 Claims, 15 Drawing Sheets

(51) Int. Cl.
  *H05K 3/40*   (2006.01)
  *H05K 3/46*   (2006.01)
  *H01L 23/15*  (2006.01)
  *H01L 23/498* (2006.01)
  *H01L 21/683* (2006.01)

(56) References Cited

U.S. PATENT DOCUMENTS

| | | | |
|---|---|---|---|
| 7,119,745 B2 | 10/2006 | Gaucher et al. | |
| 7,122,891 B2 | 10/2006 | Dishongh et al. | |
| 7,405,698 B2 | 7/2008 | De Rochemont | |
| 8,278,749 B2 | 10/2012 | Lachner et al. | |
| 8,433,402 B2 | 4/2013 | Ruben et al. | |
| 8,451,618 B2 | 5/2013 | Boeck et al. | |
| 8,460,967 B2 | 6/2013 | Lachner et al. | |
| 8,620,449 B2 | 12/2013 | Zhao et al. | |
| 8,624,381 B2 | 1/2014 | Lachner et al. | |
| 8,626,310 B2 | 1/2014 | Barror et al. | |
| 8,736,031 B2 | 5/2014 | Lee et al. | |
| 2002/0094661 A1* | 7/2002 | Enquist | H01L 21/2007 438/455 |
| 2004/0118806 A1* | 6/2004 | Kim | H01L 25/0657 216/20 |
| 2004/0126993 A1* | 7/2004 | Chan | H01L 21/02052 438/455 |
| 2005/0023629 A1 | 2/2005 | Ding et al. | |
| 2005/0046002 A1* | 3/2005 | Lee | H01L 21/76898 257/678 |
| 2009/0308640 A1* | 12/2009 | Jeung | H01L 23/3114 174/255 |
| 2010/0109966 A1 | 5/2010 | Mateychuk et al. | |
| 2010/0114246 A1 | 5/2010 | Yamamoto et al. | |
| 2011/0061884 A1* | 3/2011 | Wang | B23K 26/0604 174/50.5 |
| 2011/0104888 A1* | 5/2011 | Kim | H01L 21/76879 438/637 |
| 2011/0270341 A1* | 11/2011 | Ruben | H01L 21/76898 607/9 |
| 2012/0013012 A1* | 1/2012 | Sadaka | H01L 21/2007 257/773 |
| 2013/0334669 A1* | 12/2013 | Kuo | H01L 23/481 257/621 |
| 2014/0071021 A1 | 3/2014 | Liu et al. | |
| 2014/0145884 A1 | 5/2014 | Dang et al. | |
| 2015/0101841 A1 | 4/2015 | Ruben et al. | |

* cited by examiner

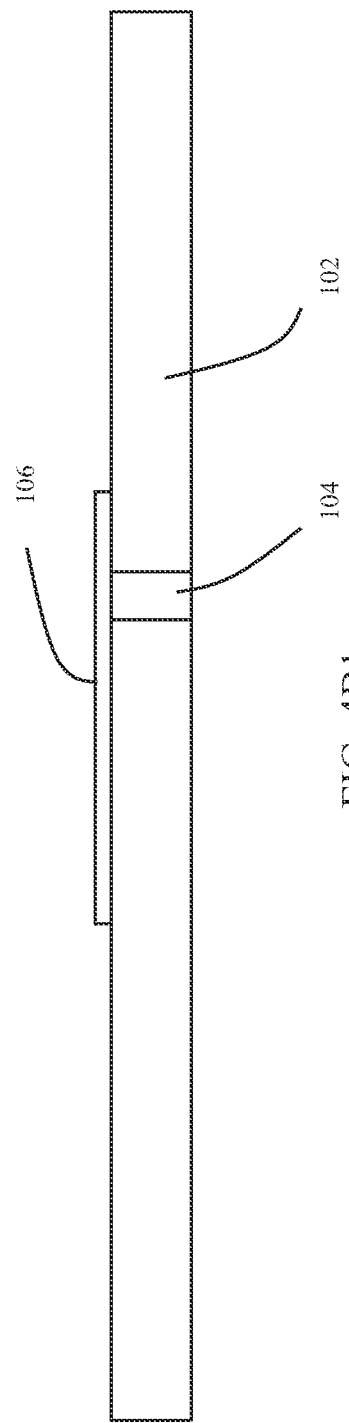

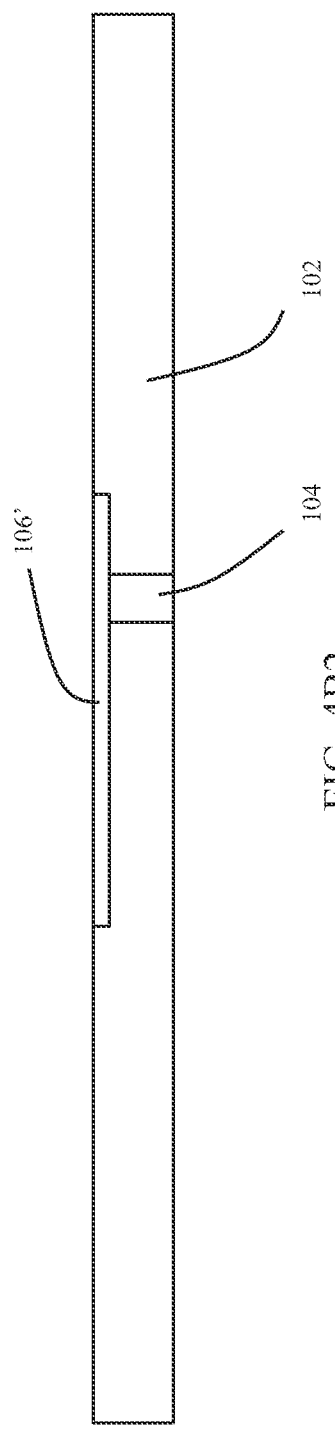

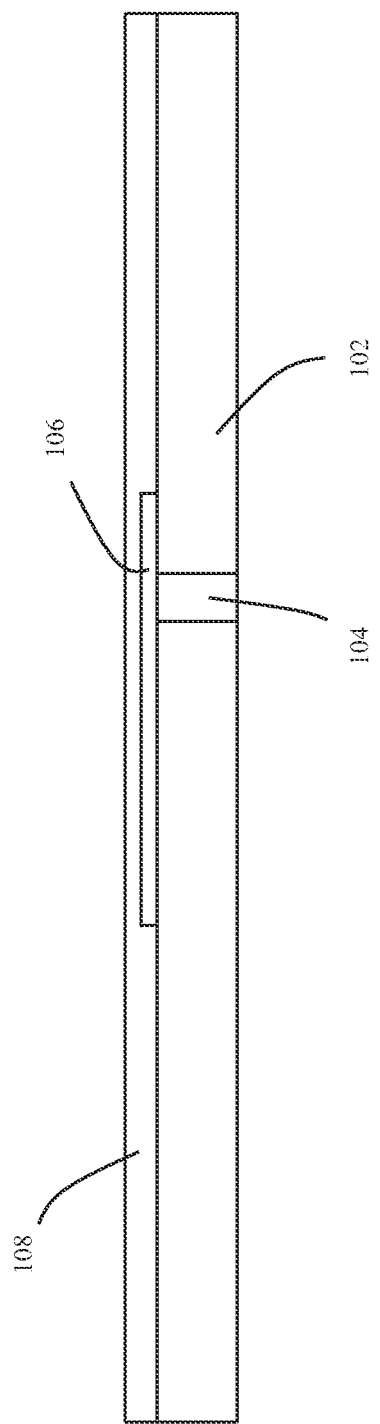

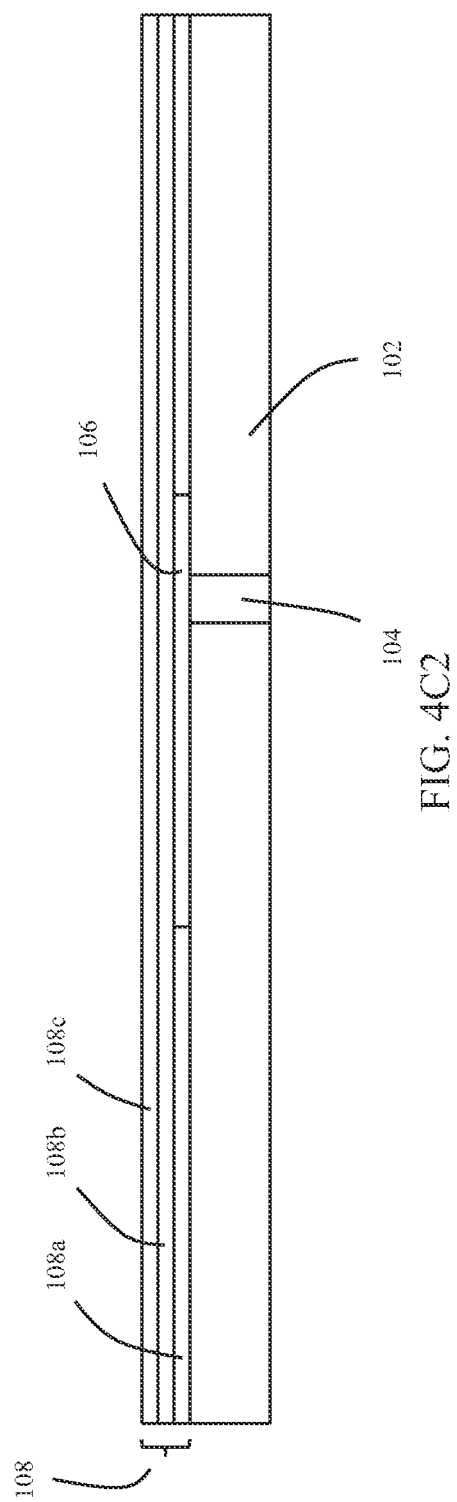

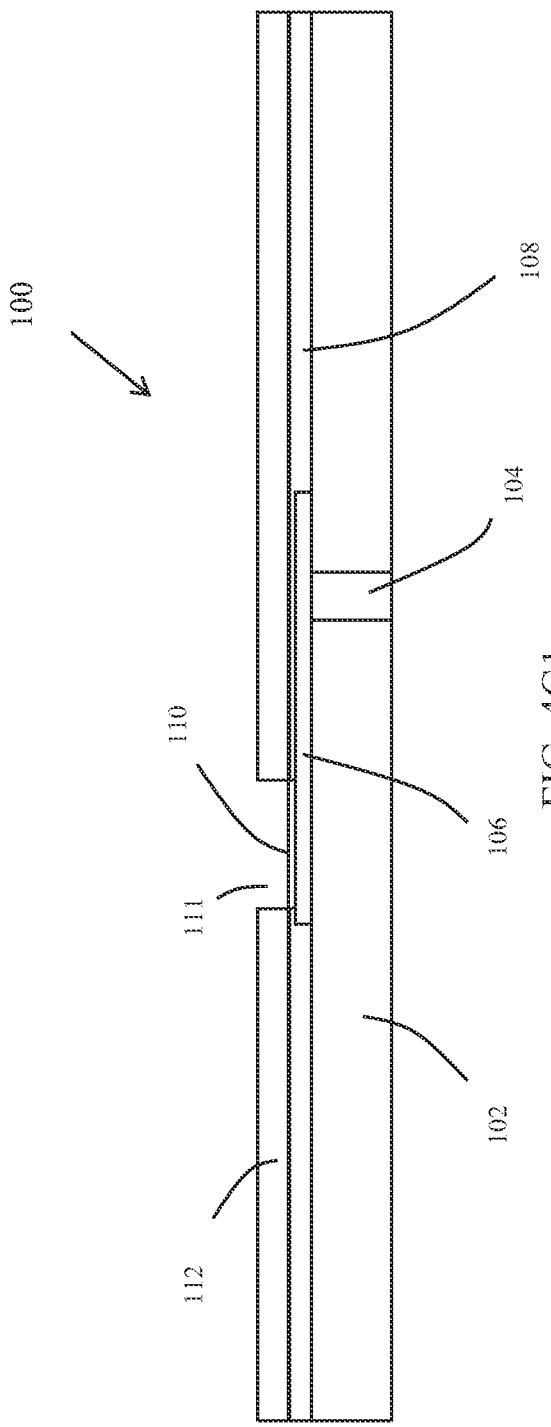
FIG. 4G1

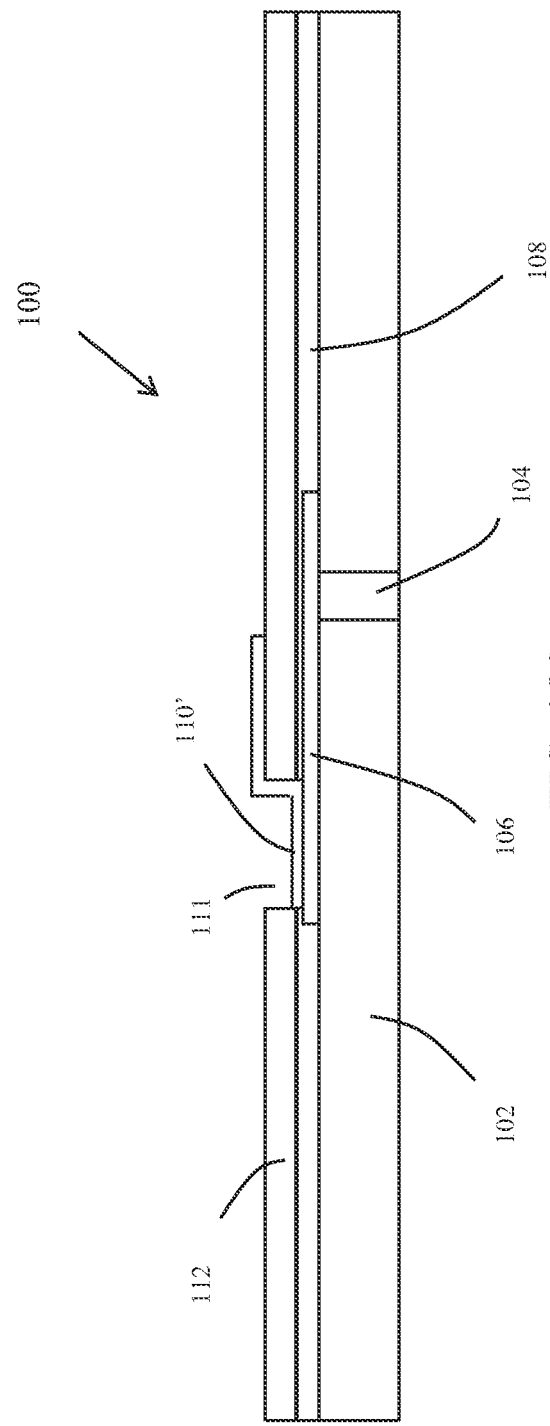
FIG. 4G2

_US 9,832,867 B2_

EMBEDDED METALLIC STRUCTURES IN GLASS

BACKGROUND

The design of implantable medical devices presents many challenges. For example, the size of the implantable medical device has to be small enough to fit within a designated area in the human body. Moreover, the smaller the device, the more likely the device will be tolerated by the body and not interfere with functions of the body. Further the housing (packaging) of the medical devices needs to provide a hermetic seal to separate the internal circuits of the device from the bodily fluids of the patient. In addition, the material used to make the housing of the device needs to be bio-stable. That is, the material should have a minimal dissolving rate when exposed to bodily fluids to prevent conductive traces and other features of the implantable medical devices from being exposed to the bodily fluids before an end of a life expectancy period of the implantable medical device.

For the reasons stated above and for other reasons stated below which will become apparent to those skilled in the art upon reading and understanding the present specification, there is a need in the art for an embedded metallic structure in glass that can be used in a device that provides a desired housing thickness and in some embodiments provides an effective hermetic seal and is bio-stable.

SUMMARY OF INVENTION

The above-mentioned problems of current systems are addressed by embodiments of the present invention and will be understood by reading and studying the following specification. The following summary is made by way of example and not by way of limitation. It is merely provided to aid the reader in understanding some of the aspects of the invention.

In one embodiment, a device having embedded metallic structures in a glass is provided. The device includes a first wafer, at least one conductive trace, a planarized insulation layer and a second wafer. The first wafer has at least one first wafer via filled with conductive material. The at least one conductive trace is formed on a surface of the first wafer. The at least one conductive trace is in contact with the at least one first wafer via that is filled with the conductive material. The planarized insulation layer is formed over the first wafer and at least one conductive trace. The planarized insulation layer further has at least one insulation layer via that provides a path to a portion of the at least one conductive trace. The second wafer is bonded to the planarized insulation layer.

In another embodiment, a method of forming metallic structures in glass of a device is provided. The method includes forming at least one conductive trace on a first wafer. An insulation layer is then formed over the first wafer and the at least one conductive trace. The insulation layer is then planarized. At least one via is etched through the insulation layer to the at least one conductive trace. At least one conductive contact layer is then formed in the at least one via in the insulation layer. A second wafer is then bonded to the insulation layer.

In still another embodiment, a method of forming metallic structures in glass of a device is provided. The method includes forming at least one conductive trace on a first wafer. A silicon dioxide layer is then formed over the first wafer and the at least one conductive trace. The silicon dioxide layer is then planarized. A via is then etched through the silicon dioxide layer to the at least one conductive trace. A conductive contact layer is then formed to fill the via in the silicon dioxide layer. A second wafer is then bonded to the silicon dioxide layer.

BRIEF DESCRIPTION OF THE DRAWINGS

The present invention can be more easily understood and further advantages and uses thereof will be more readily apparent, when considered in view of the detailed description and the following figures in which:

FIG. 4B1 is a cross-sectional view of a first wafer with a conductive trace formed thereon in one embodiment in the formation of the device with embedded metallic structures in glass of FIG. 1;

FIG. 4B2 is a cross-sectional view of a first wafer with a conductive trace formed in a trench thereof in an alternative embodiment;

FIG. 4C1 is a cross-sectional view of the first wafer with an insulation layer formed thereon in one embodiment in the formation of the device with embedded metallic structures in glass of FIG. 1;

FIG. 4C2 is a cross-sectional view of a first wafer having sub-layers of insulation formed thereon in an alternative embodiment;

FIG. 4G1 is a cross-sectional view of the second wafer bonded to the first wafer via the insulation layer in an embodiment in the formation of the device with embedded metallic structures in glass of FIG. 1;

FIG. 4G2 is a cross-sectional view of an alternative embodiment where the conductive contact layer is formed after the second wafer is bonded to the first wafer. The conductive contact layer extending along a portion of a surface of the second wafer in this embodiment of the present invention;

In accordance with common practice, the various described features are not drawn to scale but are drawn to emphasize specific features relevant to the present invention. Reference characters denote like elements throughout Figures and text.

DETAILED DESCRIPTION

In the following detailed description, reference is made to the accompanying drawings, which form a part hereof, and in which is shown by way of illustration specific embodiments in which the inventions may be practiced. These embodiments are described in sufficient detail to enable those skilled in the art to practice the invention, and it is to be understood that other embodiments may be utilized and that changes may be made without departing from the spirit and scope of the present invention. The following detailed description is, therefore, not to be taken in a limiting sense, and the scope of the present invention is defined only by the claims and equivalents thereof.

Figure 1:
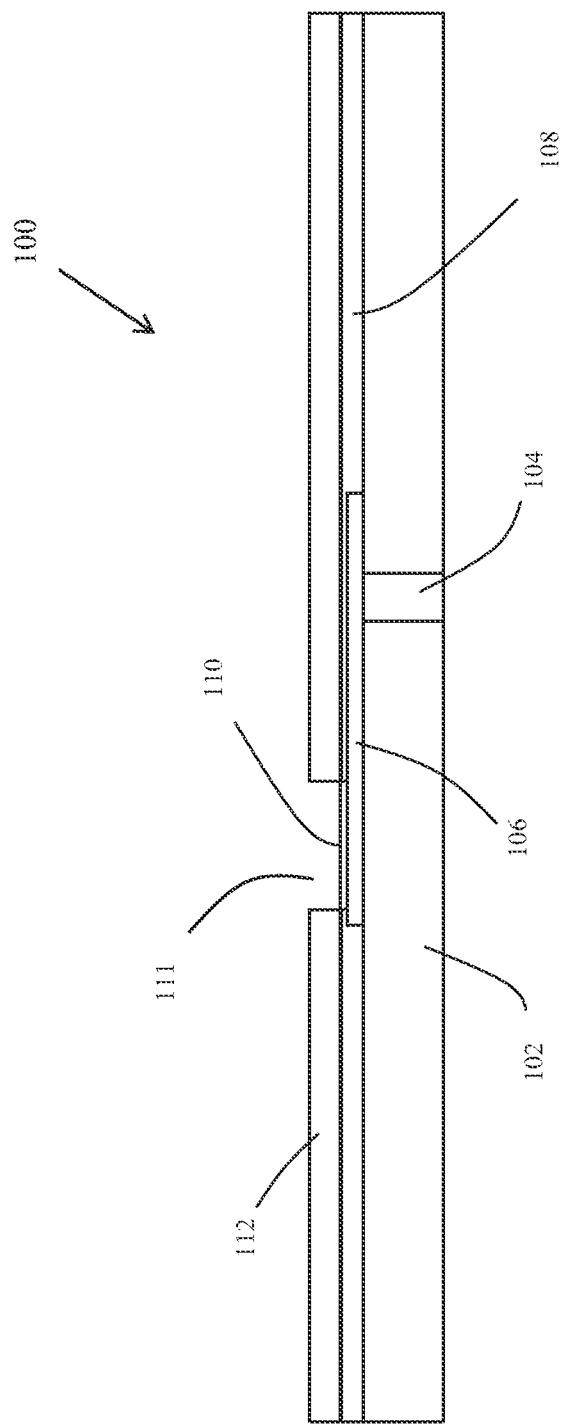
FIG. 1 is a cross-sectional side view of a portion of a device having embedded metallic structures in a glass of one embodiment of the present invention.

Embodiments of the present invention provide a method and a structure that includes embedded metallic structures in glass that can be used in devices such as, but not limited to, implantable medical devices. One benefit of embedded metallic structures in glass, as described herein, is that it provides a relatively thick wall for the package (housing). This improves the life expectancy of a package that is exposed to bodily fluids. Moreover, the design allows for elements of the device to be formed within the wall of the package itself. Being able to include elements within the wall of the package or housing reduces the overall size of the device. In some embodiments, materials with transparent properties that are compatible with optical sensors are used. FIG. 1 illustrates a partial view of a device having embedded metallic structures in a glass 100 of an embodiment. In this example embodiment, the device having embedded metallic structures in a glass 100 includes a first wafer 102 (or substrate 102). Examples of glass wafer materials include, but are not limited to fused silica, amorphous silica, borosilicate glass (BSG), sapphire and quartz. This first wafer 102 includes a via that is filled with conductive material 104 such as, but not limited to, copper, copper glass composite, silver, silver filled epoxy and silver filled glass. The device having embedded metallic structures in a glass 100 further includes a conductive trace 106 formed on a surface of the first wafer 102. In one embodiment the conductive trace is formed in a channel (or trench) in a surface of the first wafer 102. The channels or trenches in the first wafer 102 may be formed by etching, laser ablation, machining, grit blasting or similar processes. This approach allows for the incorporation of thicker conductors 106 without increasing the thickness of the insulating layer 108. The conductor deposited in the trench might be electroplated, printed or otherwise formed with the top surface of the conductor generally coplanar with the top surface of 102. The recesses may be filled above the surface of wafer 102 and then planarized to accomplish this, or the thickness of the conductor may be sufficiently controlled to match the depth of the recess. The conductive trace 106 is in contact with the conductive material 104 in the via of the first wafer 102. An example of the material used in the conductive trace 106 includes, but is not limited to, titanium nitride, titanium, niobium, tantalum, platinum, iridium and their alloys. The embedded structures in glass 100 further include an insulation layer 108. In one embodiment the insulation layer 108 is a silicon dioxide ($SiO_2$ or SILOX) layer 108 that is formed over the first wafer 102 and the conductive trace 106. Another example of material used to form the insulation layer 108 is silicon nitride. Hence, the present invention is not limited to an insulation layer 108 of silicon dioxide. The insulation layer 108 is planarized by chemical-mechanical polishing or other suitable method. A portion of the insulation layer 108 above the conductive trace 106 is removed and a conductive contact layer 110 is formed. In one example embodiment, the conductive contact layer 110 is a titanium nitride layer. A second wafer 112 is then bonded over the insulation layer 108. The second wafer 112 includes a non-filled opening 111 over the conductive contact layer 110 to provide access to the conductive contact layer 110. Further discussion of the formation of the embedded structures in glass 100 in detail is provided below. The embedded structures in glass 100 provide a structure that is hermetically sealed and is bio stable.

Figure 2A:
FIG. 2A is a cross-sectional side view of a first wafer of one embodiment of the present invention.
Figure 2B:
FIG. 2B is a cross-sectional side view of a second wafer of one embodiment of the present invention.
Figure 2C:
FIG. 2C is a cross-sectional side view of a third wafer of one embodiment of the present invention.
Figure 4A:
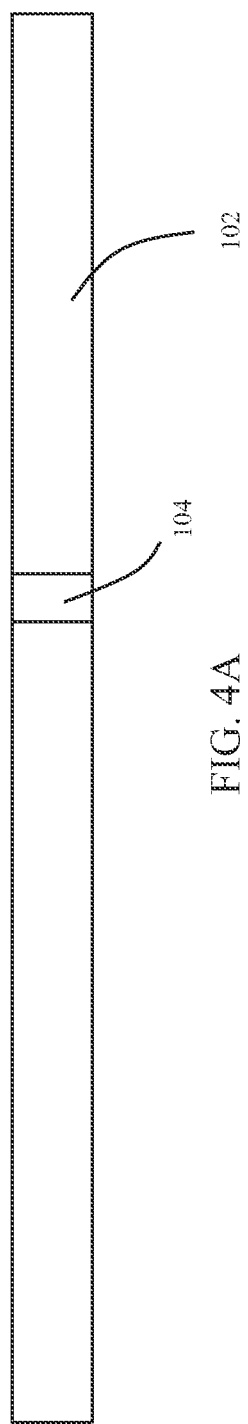
FIG. 4A is a cross-sectional view of a first wafer with a via filled with conductive material in one embodiment in the formation of the device with embedded metallic structures in glass of FIG. 1.
Figure 4D:
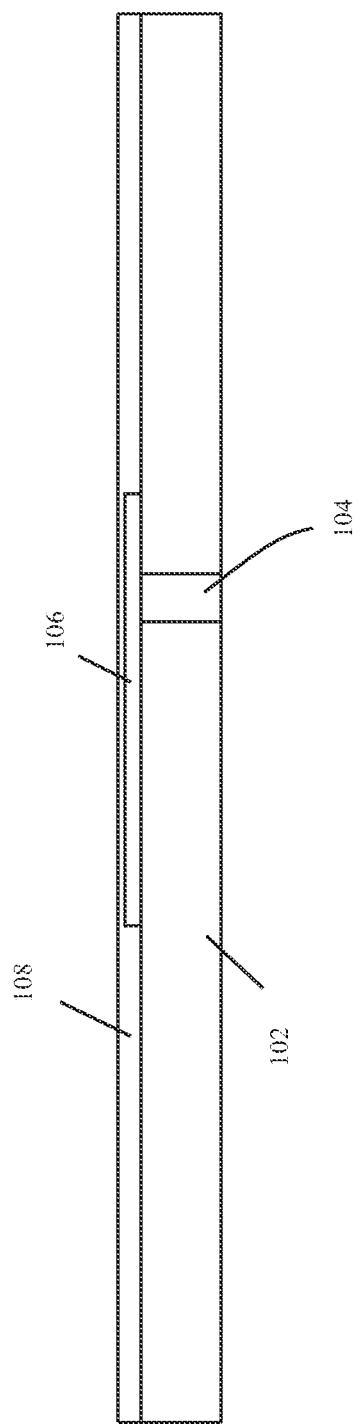
FIG. 4D is a cross-sectional view of the insulation layer after planarization in an embodiment in the formation of the device with embedded metallic structures in glass of FIG. 1.
Figure 4E:
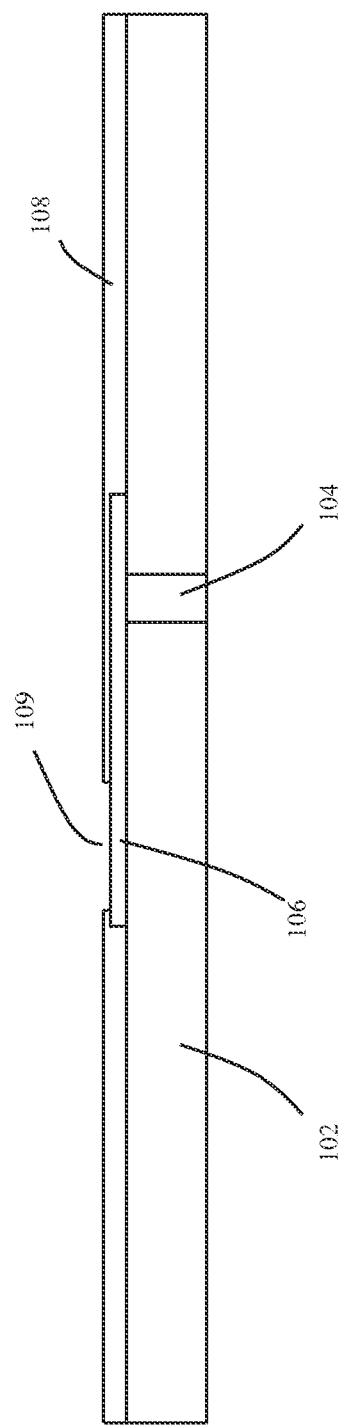
FIG. 4E is a cross-sectional view of the insulation layer having a path etched to the conductive trace in an embodiment in the formation of the device with embedded metallic structures in glass of FIG. 1.
Figure 4F:
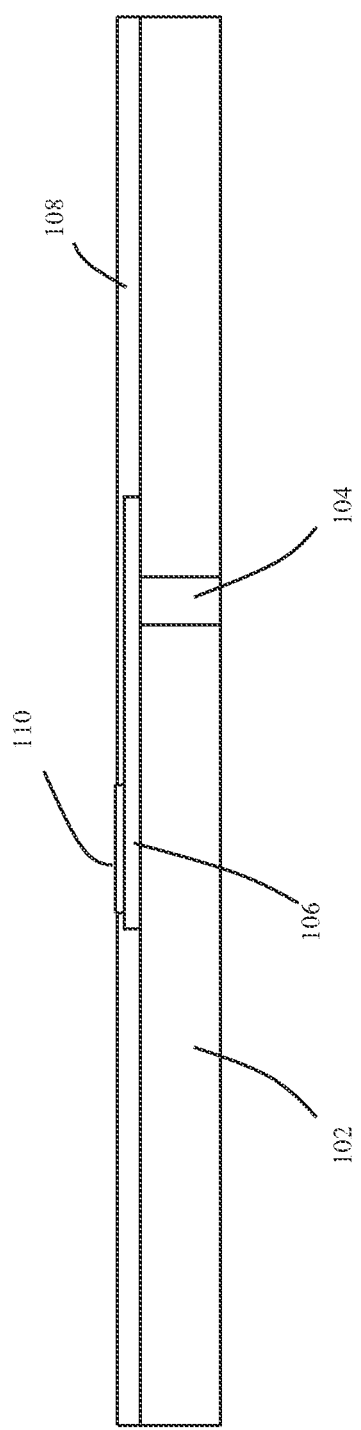
FIG. 4F is a cross-sectional view of the path to the conductive trace filled with conductive contact layer in an embodiment in the formation of the device with embedded metallic structures in glass of FIG. 1.
Figure 4H:
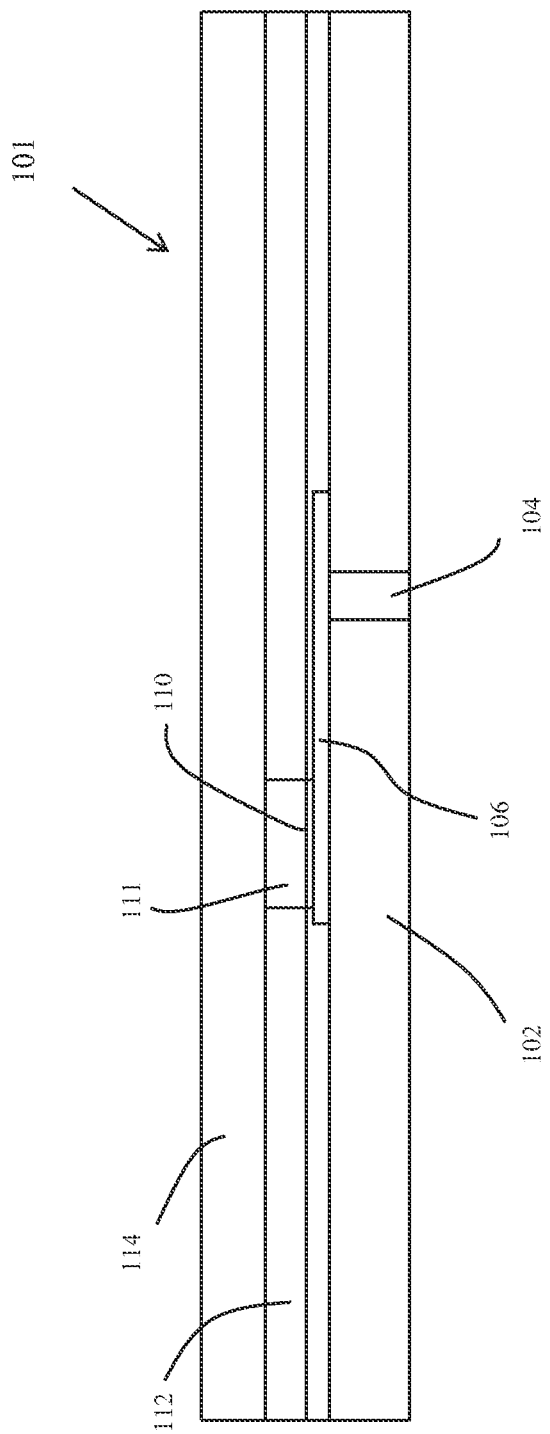
FIG. 4H is a cross-sectional view of a third temporary wafer bonded the second wafer in an embodiment of the present invention.

FIGS. 2A through 2C illustrate the basic components needed for forming a device having embedded metallic structures in a glass 100. In one embodiment, the basic components 102, 112 and 114 are chemically-mechanically polished (CMP) borosilicate glass (BSG). FIG. 2A illustrates the first wafer 102 that includes a via filled with Cu 104. In an example embodiment the thickness of the first wafer 102 is about 300 μm. However, a typical thickness in the range of 25 through 1,000 μm could be used for the first wafer 102. Moreover, thicknesses beyond the range provided for the first wafer 102 are contemplated in non-typical applications. In FIG. 2B the second wafer 112 is illustrated. The second wafer 112 includes the non-filled via 113. An example thickness for the second wafer 112 is 200 μm. However, a typical thickness in the range of 25 through 1,000 μm could be used for the second wafer 112. Moreover, thicknesses beyond the range provided for the second wafer 112 are contemplated in non-typical applications. FIG. 2C illustrates a third wafer 114. The third wafer 114 in an embodiment is a temporary protection wafer used during further processing of the device having embedded metallic structures in a glass 100. In an embodiment, the third wafer 114 is bonded over the second wafer 112. This embodiment is illustrated in FIG. 4H. An example thickness for the third wafer 114 is 200 μm. However, any thickness could be used for the third wafer 114 that provides adequate protection of second wafer 112 and the conductive contact layer 110.

Figure 3:
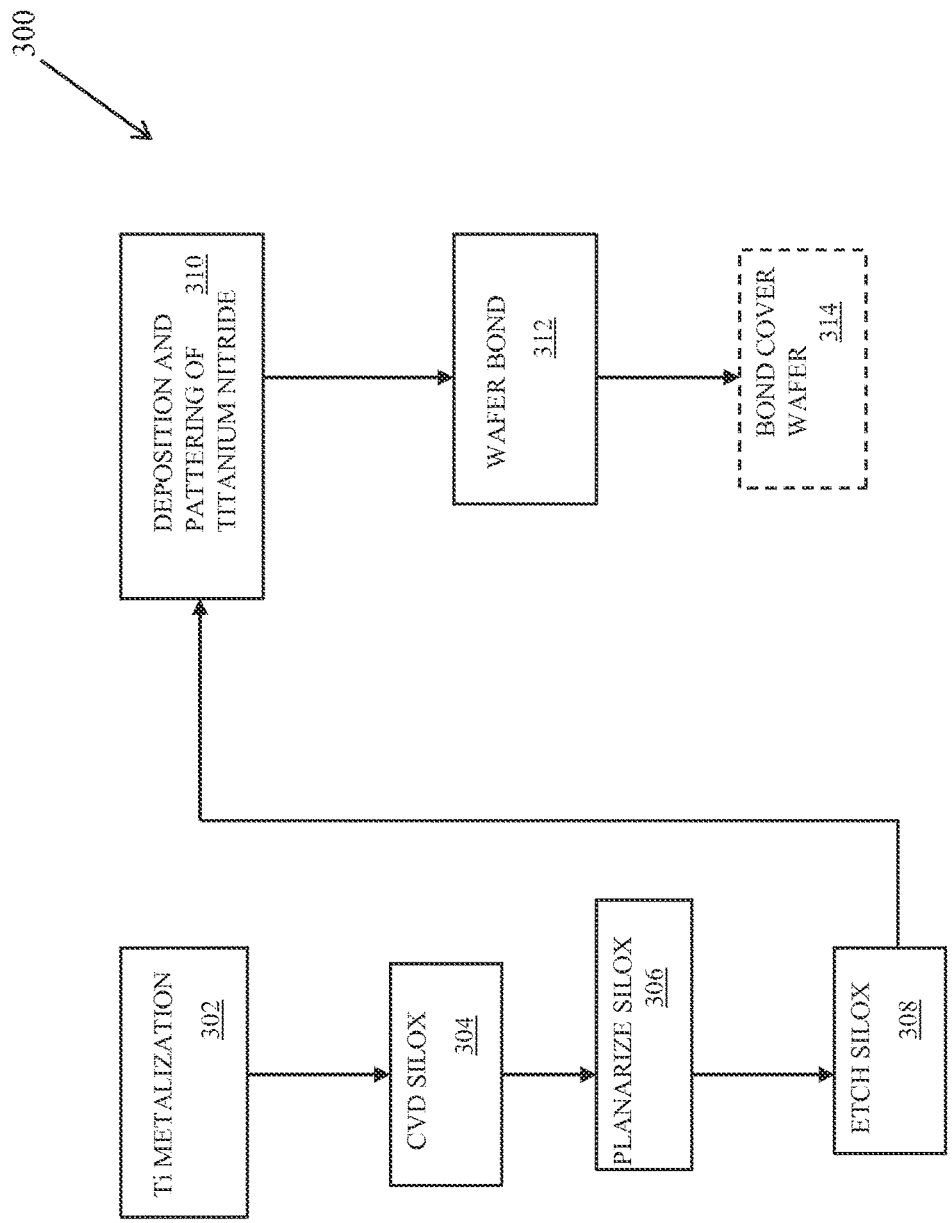
FIG. 3 is a process flow diagram of one embodiment of the present invention.

Formation of the embedded structures in glass 100 with the third temporary wafer 114 is discussed in light of the process flow diagram 300 of FIG. 3 and the formation illustrations 4A through 4H. The process starts with the first wafer 102 with the via filled with conductive material 104 as illustrated in FIG. 4A. As discussed above, in one embodiment, the first wafer 102 is CMP BSG with the conductive material 104 being Cu. The process continues by forming the conductive trace 106 on the first wafer 102 (302). In one embodiment, this is formed with Ti metallization. Metallization is a process that deposits a thin metal film on the wafer surface. The metallization process is done by methods known in the art including depositing a thin metal film with chemical vapor deposition (CVD) or physical vapor deposition (PVD) and then patterning the thin metal film to form the conductive trace 106. The conductive trace 106 formed on a surface of the first wafer 102 is illustrated in FIG. 4B1. In an alternative embodiment the conductive trace 106 is formed in trench as described above. In this alternative embodiment, the conductive trace 106' is deposited in the trench. The conductive trace 106' may be electroplated, printed or otherwise formed with the top surface of the conductive trace 106' generally coplanar with the top surface of 102. The recesses may be filled above the surface of wafer 102 and then planarized to accomplish this, or the thickness of the conductor may be sufficiently controlled to match the depth of the recess. Once the conductive trace 106 is formed, the insulation layer 108 is formed. In one embodiment, the insulation layer 108 is a silicon dioxide layer 108 that is formed by CVD (304). In another embodiment, the insulation layer 108 may be deposited as a spin-on glass. An illustration of the formed silicon dioxide layer 108 is illustrated in FIG. 4C1. In an alternative embodiment, the insulation layer 108 is made of a plurality of sub-layers 108a, 108b and 108c as illustrated in FIG. 4C2. In one example embodiment, sub-layer 108a is a layer of silicon dioxide, sub-layer 108b is a layer of silicon nitride and sub-layer 108c is a layer of silicon dioxide. After the insulation layer 108 is formed, it is planarized (306). Planarization is a process that smoothes out a surface which can be done by chemical forces, mechanical forces or both. In the planarization process, a sufficient amount of material is removed to eliminate the topography of the underlying traces and structures and allow a bond between the insulation layer 108 and the second wafer 112 discussed below. Moreover, the thickness of the insulating layer to be removed depends on the thickness of the trace 106 and the method of deposition of the insulating layer. It is typical to remove a thickness of the insulator 108 approximately equal to the thickness of the trace 106. In one example embodiment, 5 Å to 10 Å are polished off during planarization. In another example embodiment, 0.5 to 2 μm is removed. An illustration of the planarized silicon dioxide layer 108 is shown in FIG. 4D.

Once the silicon dioxide layer is planarized, a via (path) 109 is etched in the insulation layer 108 to the conductive trace 106 (308) to open a path to the conductive trace 106 (electrode). An illustration of the insulation layer 108 etched is shown in FIG. 4E. Although only one conductive trace 106 is illustrated in FIG. 4E it is anticipated that any number of conductive traces could be used in a device and any number of etched vias could be used depending on the application. Etching techniques known in the art can be used to etch the via in the silicon dioxide layer 108. Once the path 109 to the conductive trace 106 is opened, a conductive contact layer (a layer of titanium nitride in an embodiment) is formed in the via 109 of the silicon dioxide layer 108 (310). Other types of material that can be used for the conductive contact layer include, but are not limited to, titanium, niobium, platinum and tantalum. In one embodiment the formation of the conductive contact layer is done with a liftoff process. In an example liftoff process, a positive photoresist is spun on a wafer and patterned using standard photolithographic techniques. The titanium nitride is then deposited on top of the wafer surface. The device is then immersed in a suitable solvent while being subject to ultrasonic agitation. This dissolves the photoresist and lifts off the areas of titanium nitride deposited over the photo resist while leaving the titanium nitride in areas where the photo resist had previously been removed by patterning. The contact metallization may also be deposited and subsequently patterned by standard photolithographic and etching methods. An example of the conductive contact layer 110 formed in the via 109 of the silicon dioxide layer 108 is illustrated in FIG. 4F. Once the titanium nitride is formed in the via 109 of the silicon dioxide layer 108, the second wafer 112 is bonded to the SILOX layer 108 (312). The non-filled via 111 (or opening) of the second wafer 112 is aligned with the titanium nitride layer 110. In one embodiment, a fusion bond is used to bond the second wafer 112 to the insulation layer 108 (which is on top of the first wafer 102). In fusion bonding the second wafer 112 to the insulation layer 108, a surface of the second wafer 112 is positioned in contact with the planarized insulation layer 108. The device is then typically heated up above 600 degrees. An example of the second wafer 112 being bonded to the titanium nitride layer is illustrated in FIG. 4G1. In an alternative embodiment, a conductive contact layer 110' (contact pad) is deposited and patterned after the second wafer 112 had been bonded to the insulation layer 108. This is illustrated in FIG. 4G2. In this embodiment, the conductive contact layer 110' extends over a portion of the surface of the second wafer 112.

In one embodiment, an optional temporary cover wafer (third wafer) 114 is bonded to the second wafer 112 (314). The wafers may be bonded in selected areas to facilitate subsequent separation by dicing or other methods. Further, in one embodiment, a laser bond is used to bond the third wafer 114 to the second wafer 112. The third wafer 114 is illustrated covering the non-filled via (opening) 111 of the second wafer 112. An example of this is illustrated in FIG. 4H. A laser bond heats up the matter at the interface causing the materials to diffuse into each other therein creating a bond when cooled. In embodiments, techniques for bonding substrate materials together with electromagnetic radiation and an intermediate layer is employed to bond layers described in the present application. Examples of these techniques are found in commonly assigned U.S. Pat. No. 8,796,189 herein incorporated by reference. The laser bonding process described fuses two substrates together using an intermediate layer. Generally in this process, the substrates to be bonded are polished and cleaned. An intermediate layer is deposited on one of the polished substrates while the other polished surface of the other substrate is positioned on the other side of the intermediate layer such that the intermediate layer is sandwiched between the polished surfaces of the substrates to be bonded. Electromagnetic radiation is then directed through one of the substrates to the intermediate layer. This causes the intermediate layer to heat up and form an enhanced bond between the substrates. The optional third wafer 114 is used to temporally cover and protect the contact pad 110 during subsequent processing. In a medical device example, the temporary third wafer 114 would be removed after the processing to expose the contact pad 110 to the body of the patient.

Figure 5:
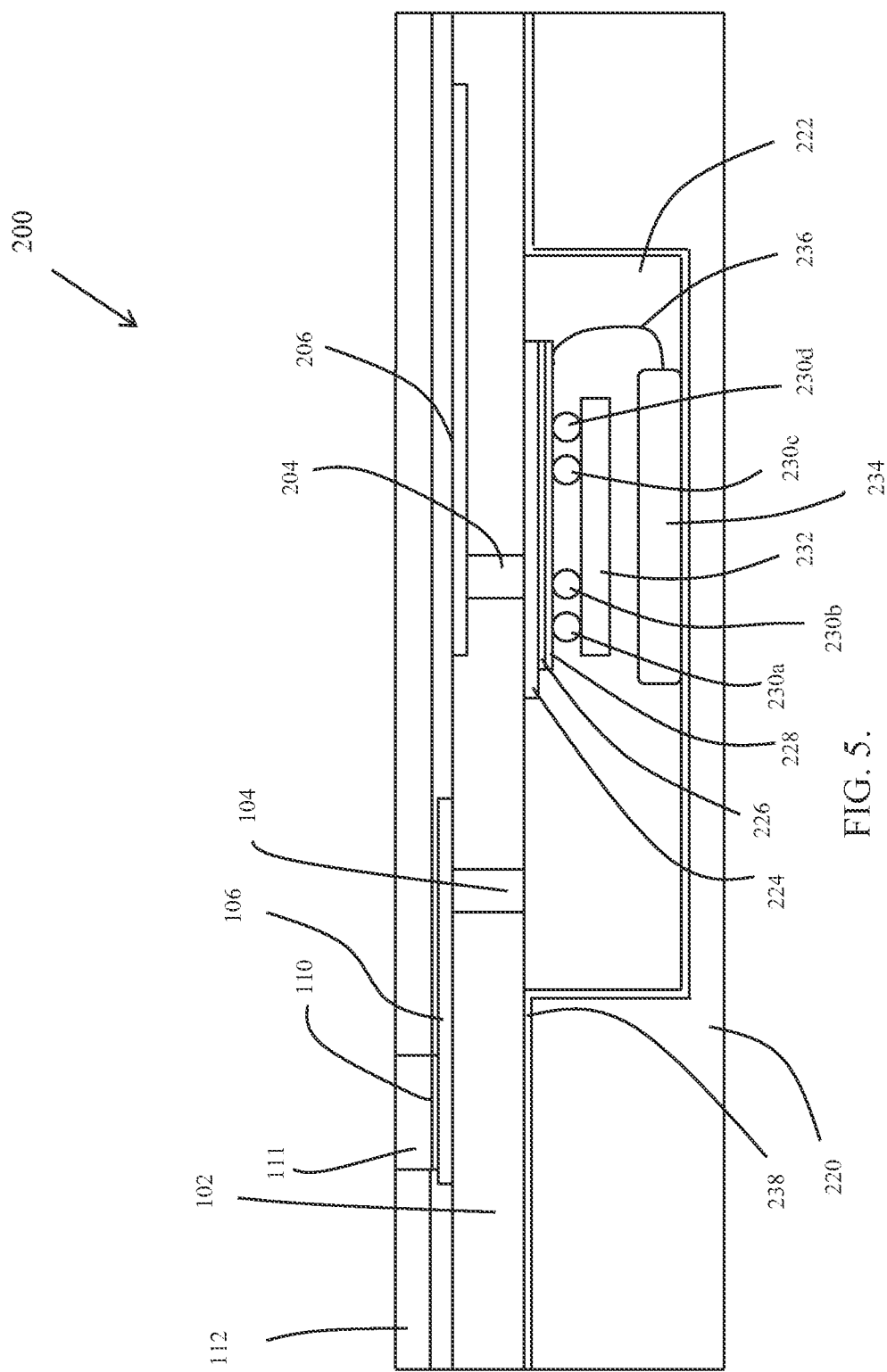
FIG. 5 is a partial cross-sectional view of an implantable medical device having embedded metallic structures in glass that includes an antenna system formed in a package of the implantable medical device of one embodiment of the present invention.

The above device having embedded metallic structures in a glass 100 has many applications. The hermitic and bio stable construction of the device having embedded metallic structures in a glass 100 makes it ideal for implantable medical devices. Moreover the benefit of the construction provides a structure that has a relatively thick covering over the conductive traces as discussed above. For example, a covering over the metal trace 106 described above will be greater than 25 μm. Many insulator materials used in implantable medical devices (IMDs) will dissolve at a rate of less than 1 micron per year. Hence, the added thickness of the covering that covers that the conductive traces will extend the life of the IMDs. An example of an IMD implementing the embedded metallic structures in a glass 100 is illustrated in FIG. 5. In this example, the implantable medical device includes an antenna structure that is formed in a housing of the device using the techniques described above. Placing the antenna structure in the housing reduces the size of the IMD while the increases in thickness of the cover increases the life expectancy of the IMD. This example device includes a metal filled via 204 in the first wafer 102 to a metal filled channel 206 that is part of the antenna structure. A cap wafer (fourth wafer) 220 has a formed device chamber 222. A layer of silicon 238 is used to bond the first wafer 102 and the fourth wafer 220 in a laser bonding process as described above. Interconnect metal layers 224, 226 and 228 are formed between the metal filled via 204 and the device chamber 222. In one embodiment, layer 224 is an aluminum layer, layer 226 is a titanium layer and layer 228 is a nickel-vanadium/gold layer. Active and passive electrical components and devices, such as but not limited to, device controller 232 may be attached and electrically connected to interconnect metal layers 224, 226 and 228 using standard surface mount or chip and wire processes known in the art. For example, solder balls 230a, 230b, 230c and 230d are illustrated as proving electrical connections between the device controller 232 and interconnect layer 228. Moreover, a battery 234 is positioned within the device chamber 222. The battery 234 is connected to the interconnection metal layers 224, 226 and 228 via an electrical connection designated generally as 236.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A device having embedded metallic structures in a glass comprising: a first wafer having at least one first wafer via filled with conductive material; at least one conductive trace formed on the first wafer, the at least one conductive trace being in contact with the at least one first wafer via filled with the conductive material; a planarized insulation layer formed over the first wafer and at least one conductive trace, the planarized insulation layer further having at least one insulation layer via that provides a path to a portion of the at least one conductive trace, at least one conductive contact layer within at least a portion of the at least one insulation layer via, the at least one conductive contact layer being in contact with the at least one conductive trace: and a second wafer fusion bonded to the planarized insulation layer, the second wafer having at least one non-filled via aligned with the at least one conductive contact layer, and at least one antennal structure in the first wafer, the antenna structure comprising a metal filled channel in the first wafer in contact with a second first wafer via filled with conductive material.

2. The device having embedded metallic structures in a glass of claim 1, wherein the first wafer and the second wafer are made of at least one from a group including silica, borosilicate glass, sapphire and quartz.

3. The device having embedded metallic structures in a glass of claim 1, wherein the conductive trace comprises at least one of titanium nitride, titanium, niobium, tantalum, platinum, platinum, iridium, titanium nitride alloy, titanium alloy, niobium alloy, tantalum alloy, platinum alloy, platinum alloy and iridium alloy and the conductive material that fills the first wafer via comprises at least one of copper, tungsten, copper glass composite, platinum glass composite, silver, silver filled epoxy and silver filled glass.

4. The device having embedded metallic structures in a glass of claim 1, wherein the planarized insulation layer is at least one layer of silicon dioxide.

5. The device having embedded metallic structures in a glass of claim 1, wherein the planarized insulation layer is made up of a plurality of sub-layers of silicon dioxide and silicon nitride.

6. The device having embedded metallic structures in a glass of claim 1, wherein the embedded metallic structure in glass is part of a package of an implantable medical device.

7. The device having embedded metallic structures in glass of claim 1, wherein the at least one conductive contact layer is a layer comprising titanium, titanium nitride, niobium or tantalum.

8. The device of claim 1, wherein the second wafer has a thickness that is greater than 25 μm.

9. The device having embedded metallic structures in glass of claim 1, wherein the at least one conductive trace is at least partially positioned within at least one trench in a surface of the first wafer.

10. A device having embedded metallic structures in a glass comprising: a first wafer having at least one first wafer via filled with conductive material; at least one conductive trace formed on the first wafer, the at least one conductive trace being in contact with the at least one first wafer via filled with the conductive material; a planarized insulation layer formed over the first wafer and at least one conductive trace, the planarized insulation layer further having at least one insulation layer via that provides a path to a portion of the at least one conductive trace, at least one conductive contact layer within at least a portion of the at least one insulation layer via, the at least one conductive contact layer being in contact with the at least one conductive trace: and a second wafer laser bonded to the planarized insulation layer, the second wafer having at least one non-filled via aligned with the at least one conductive contact layer, and at least one antennal structure in the first wafer, the antenna structure comprising a metal filled channel in the first wafer in contact with a second first wafer via filled with conductive material.

* * * * *